(12) United States Patent
Mitchell et al.

(10) Patent No.: US 6,362,417 B2
(45) Date of Patent: Mar. 26, 2002

(54) EMI SHIELDED VENT PANEL AND METHOD

(75) Inventors: Jonathan E. Mitchell, Cambridge; Charlene Andersen, Haverhill, both of MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 09/737,195

(22) Filed: Dec. 15, 2000

Related U.S. Application Data (62) Division of application No. 09/243,778, filed on Feb. 3, 1999, now Pat. No. 6,211,458.
(60) Provisional application No. 60/074,929, filed on Feb. 17, 1998.

(51) Int. Cl.[7] .................................................. H05K 9/00
(52) U.S. Cl. ............................ 174/35 GC; 174/35 MS; 174/35 R; 361/816; 361/692; 361/693; 454/184
(58) Field of Search .......................... 174/35 R, 35 MS, 174/35 GC; 361/816, 818, 692, 693; 454/184

(56) References Cited

U.S. PATENT DOCUMENTS

| | | |
|---|---|---|
| 3,546,359 A | 12/1970 | Ciccarelli et al. |
| 3,553,343 A | 1/1971 | Garlington |
| 3,580,981 A | 5/1971 | Lamp et al. |
| 3,584,134 A | 6/1971 | Nichols et al. |
| 3,821,463 A | 6/1974 | Bakker |

(List continued on next page.)

FOREIGN PATENT DOCUMENTS

| | | |
|---|---|---|
| JP | 08 064988 A | 3/1996 |
| WO | WO 97 32459a | 9/1997 |

OTHER PUBLICATIONS

Various pages from EMI Shielding for Military/Aerospace Engineering Handbook of Parker–Hannifin Corporation, Chomerics Division, copyrighted 1996.
International Search Report filed in PCT Application No. PCT/YS99/02368.

*Primary Examiner*—Dean A. Reichard
*Assistant Examiner*—Hung V Ngo
(74) *Attorney, Agent, or Firm*—John A. Molnar, Jr.

(57) ABSTRACT

An electromagnetic interference (EMI) shielded vent panel construction for disposition over an opening of an electronics enclosure. The panel includes an electrically-conductive medium having an outer periphery supported within an electrically-conductive frame. The frame is configured as having a generally C-shaped cross-sectional profile and includes an elongate end wall having an interior an exterior surface, and a pair of oppositely-disposed side walls extending from the end wall interior surface. Each of the side walls has an outer surface, one of which is disposable about the opening of the enclosure in electrically-conductive adjacency with the surface thereof, and an inner surface spaced-apart a first predetermined distance from the inner surface of the other of the side walls. The outer periphery of the medium is received intermediate the inner surfaces of the side walls such that each extends over a corresponding edge portion of the medium faces. Along with the medium, an electrically-conductive gasket is disposed intermediate the inner surface of a first one of the side walls and the edge portion of a first one of the medium faces. The gasket extends along substantially the entire perimeter of the frame and is deflectable between the side wall inner surface and the corresponding edge portion of the medium face. As assembled, the frame is compressed to space each of the side wall inner surfaces a second predetermined distance apart deflecting the gasket into a collapsed orientation providing electrical grounding contact between the frame and the medium.

8 Claims, 4 Drawing Sheets

U.S. PATENT DOCUMENTS

| | | | |
|---|---|---|---|
| 4,354,372 A | | 10/1982 | Inoue et al. |
| 4,381,421 A | * | 4/1983 | Coats et al. ............... 174/35 R |
| 4,616,101 A | | 10/1986 | Veerman et al. |
| 4,851,608 A | * | 7/1989 | Seip ...................... 174/35 MS |
| 4,857,668 A | * | 8/1989 | Buonanno .............. 174/35 GC |
| 5,032,689 A | | 7/1991 | Halligan et al. |
| 5,272,899 A | | 12/1993 | Mediate |
| 5,527,625 A | | 6/1996 | Bodnar |
| 5,640,869 A | | 6/1997 | Takeda et al. |
| 5,910,639 A | * | 6/1999 | Kunkel .................. 174/35 MS |
| 5,928,076 A | * | 7/1999 | Clements et al. ........... 454/184 |
| 5,991,163 A | * | 11/1999 | Marconi et al. ............ 361/788 |

* cited by examiner

EMI SHIELDED VENT PANEL AND METHOD

RELATED CASES

This application is a divisional of U.S. application Ser. No. 09/243,778, filed Feb. 3, 1999, U.S. Pat No. 6,211,458 which claims priority to U.S. Provisional Application Ser. No. 60/074,929, filed Feb. 17, 1998, the disclosures of which are expressly incorporated herein by reference.

BACKGROUND OF THE INVENTION

The present invention relates broadly to an electromagnetic interference (EMI) shielded or grounded panel assembly including a porous, electrically-conductive shielding media and an electrically-conductive frame for supporting the media, and more particularly to such an assembly which is adapted to cover a corresponding ventilation opening in an electronics housing or other enclosure enclosures and which accommodates the flow of cooling air into the enclosure while maintaining electrical continuity and EMI shielding effectiveness across the opening.

The operation of electronic devices such as televisions, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

For attenuating EMI effects, shielding having the capability of absorbing and/or reflecting EMI energy may be employed both to confine the EMI energy within a source device, and to insulate that device or other "target" devices from other source devices. Such shielding is provided as a barrier which is interposed between the source and the other devices, and most often is configured as an electrically conductive and grounded housing or other enclosure, such as a room, which surrounds the EMI generating circuitry of the source device. However, when such circuitry is contained within the confined space of an enclosure, it often is necessary to provide a cooling or ventilation means to dissipate the heat which is ohmicly or otherwise generated by the circuitry. Most enclosures therefore are formed with one or more air intake and/or exhaust openings or ports for natural or forced convective circulation of air between the interior of the enclosure and the ambient environment.

Left uncovered, such openings would represent a discontinuity in the surface and ground conductivity of the enclosure, with the result of a decrease in the EMI shielding effectiveness of the enclosure. Accordingly, shielded vent panels have been proposed for covering the openings in an manner which allows for the ventilation of the enclosure while electrical continuity, i.e., grounding, across the vent opening is maintained. In basic construction, such vent panels, which are sized to span the corresponding opening in the enclosure, conventionally are formed as including a sheet of a porous, electrically-conductive shielding media, and an electrically-conductive frame member configured to support the media as extending about the outer periphery thereof. The media, which may be an expanded metal mesh or, alternatively, a honeycombed-structured or other cellular structured metal foil, is received in or otherwise is attached to the frame, which typically is provided as an extruded aluminum or other metal profile. The frame, in turn, may be fastened to the enclosure over the opening thereof with screws or the like, with a compressible, electrically-conductive seal or gasket optionally provided for improved electrical contact between the frame and the enclosure.

However, for electrical continuity to be maintained across the opening, good electrical contact must be provided not only as between the frame and the enclosure, but also as between the media and the frame. In this regard, conventional panels may employ a C-shaped frame channel including a V-shaped or other projection integrally formed within one of the sides of the channel. With the peripheral edges of the media being received within the channel, the sides thereof are compressed to cause the projection to penetrate into the media and thereby establish good electrical contact. Vent panels of such type are marketed commercially by the Chomerics Division of Parker-Hannifin Corp. (Woburn, Mass. under the tradenames "Cho-Cell™," "Shield Cell®," and "Omni Cell®." Alternatively, the media may be fit into the frame and then bonded thereto using a conventional joining technique such as resistance welding, brazing, soldering, or the like.

Another method of attaching the media to the frame involves using the gasket typically provided between the frame and the enclosure to hold the filter media in place. As is described in commonly-assigned U.S. Pat. No. 5,032,689, the frame in such method may be integrally-formed as including a ridge over which the gasket is press-fitted for its retention about the periphery of the frame. The gasket, in turn, may be configured to overlap the media for securing the media to the frame.

U.S. Pat. No. 3,580,981 discloses another shielding vent panel wherein an electrically conductive textile is positioned about the periphery of the media for contact between the media and the frame which may have an L-shaped or generally Z-shaped profile. To assure good conductivity, the frame, media, and textile are covered with an electrically-conductive coating or plating such as by immersion in a molten tin or metal bath. Other vents and materials therefor are described in U.S. Pat. Nos. 3,546,359; 3,553,343; 3,584,134; 3,821,463; and 4,616,101.

In view of the continued proliferation of electronic devices, it is to be expected that continued improvements in EMI shielded vent panels would be well-received by industry, and particularly by semi-conductor manufacturers for use in the processing of silicon wafers and the like. A preferred seal construction would be economical to manufacture, but also would exhibit reliable shielding performance in assuring good electrical contact between the shielding media and the frame member.

BROAD STATEMENT OF THE INVENTION

The present invention is directed to an EMI shielded vent construction including an electrically-conductive frame member having a generally U- or C-shaped profile including and end wall portions and a pair of side wall portions integral with the end wall portion, and an electrically-conductive, porous shielding medium member, which is supported by the frame member. With the periphery of the shielding medium member being received within the frame member intermediate the lateral or side wall portions thereof, the frame member may be compressed, such as within a hydraulic platen press or the like, to retain the medium member therein. However, in accordance with the present invention, a resilient, electrically-conductive strip gasket element further is provided as interposed between the medium member and one of the side wall portions of the frame member prior to the compression thereof. Such gasket member conforms under the applied pressure to any irregularities between the interfacing surfaces of the medium member and the frame member in ensuring that a substantially continuous conductive pathway is developed across those surfaces without the provision of an additional conductive coating or plating. Advantageously, the provision of the gasket member obviates the need to integrally form a contact projection within the frame member, and thus allows the frame member to be constructed of a roll formed aluminum or other metal channel rather than of a more costly extruded profile. The use of roll formed channel, moreover, allows a continuous length thereof to be folded or otherwise shaped into a rectangular, square, or other closed geometry and thereby eliminates the need for welds at the frame member corners.

In one disclosed embodiment, the frame member is formed of aluminum or another metal, with the medium being formed of a layer of an aluminum or other metal foil which is folded, bent, or otherwise shaped into a cellular honeycomb structure to extend along a transverse axis intermediate a generally planar first and second face. Although the strip gasket element may be formed of any resilient, electrically conductive material such as a metal-filled elastomeric extrusion, or a foam extrusion sheathed in an electrically conductive mesh or fabric, an all-metal, knitted wire construction may be specified for economic or performance considerations. In a preferred construction, the compression of the frame member advantageously effects the compression of both the gasket and the peripheral edges of the medium to provide a greater surface area of electrical contact therebetween.

It is therefore a feature of the present invention to provide an electromagnetic interference (EMI) shielded vent panel construction for disposition over a corresponding opening formed within a surface of an electronics enclosure. The vent panel includes an electrically-conductive medium having an outer periphery and extending along a transverse axis intermediate a pair of faces defining a thickness dimension. Such dimension is supported within an electrically-conductive frame having a perimeter defining a closed geometric area selected to circumscribe the opening of the electronics enclosure. The frame is configured as having a generally C-shaped cross-sectional profile and includes an elongate end wall having an interior surface and an exterior surface, and a pair of oppositely-disposed side walls extending from the interior surface of the end wall. Each of the side walls has an outer surface, one of which is disposable about the opening of the enclosure in electrically-conductive adjacency with the surface thereof, and an inner surface spaced-apart a first predetermined distance from the inner surface of the other of the side walls. The outer periphery of the medium is received intermediate the inner surfaces of the side walls such that each of said walls extends over a corresponding edge portion of the faces of the medium. Along with the medium, an electrically-conductive gasket is disposed intermediate the inner surface of a first one of the side walls and the edge portion of a first one of the medium faces. The gasket extends along substantially the entire perimeter of the frame and is deflectable between the inner surface of said first one of said side walls and the edge portion of said first one of the faces of said medium. As assembled, the frame is compressed to space the inner surface of each of the side walls thereof a second predetermined distance from the inner surface of the other of said side walls deflecting the gasket into a collapsed orientation effective to provide substantially continuous electrical contact between the frame and the medium.

The present invention, accordingly, comprises the vent panel possessing the combination of elements and construction which are exemplified in the detailed disclosure to follow. Advantages of the present invention include a vent panel exhibits reliable EMI shielding and air flow characteristics. Additional advantages include a panel construction which is economical in allowing the use of a roll formed frame, and which ensures good electrical contact between the shielding medium and the frame without the need for a separate metal plating operation. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "inner," or "inboard" and "outward," "outer," or "outboard" referring, respectively, to directions toward and away from the center of the referenced element, and the terms "radial" and "axial" referring, respectively, to directions perpendicular and parallel to the longitudinal central axis of the referenced element. Terminology of similar import other than the words specifically mentioned above likewise is to be considered as being used for purposes of convenience rather than in any limiting sense.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows.

For the purposes of the discourse to follow, the precepts of the inventive EMI shielded vent panel, referenced at 10 in FIG. 1, herein involved are described in connection with its mounting onto a surface, 12, of a electronics enclosure, such as the EMI shielded housing shown in phantom at 14. Within this representative application, panel 10 is mounted using, for examples, screws, bolts, or other fastening members, over a corresponding opening formed within housing 14. Such opening generally will be formed as having a predefined outer margin, shown in phantom at 16, about which panel 10 is circumscribed to cover the opening in a manner providing ventilation without compromising the EMI shielding effectiveness of the housing 14. It will be appreciated, however, that aspects of the present invention may find utility in other EMI shielding applications. For example, panel 10 of the invention alternatively may be mounted onto the wall of an EMI shielded room for covering a ventilation opening thereof. Use within those such other applications therefore should be considered to be expressly within the scope of the present invention.

Figures 1, 2:
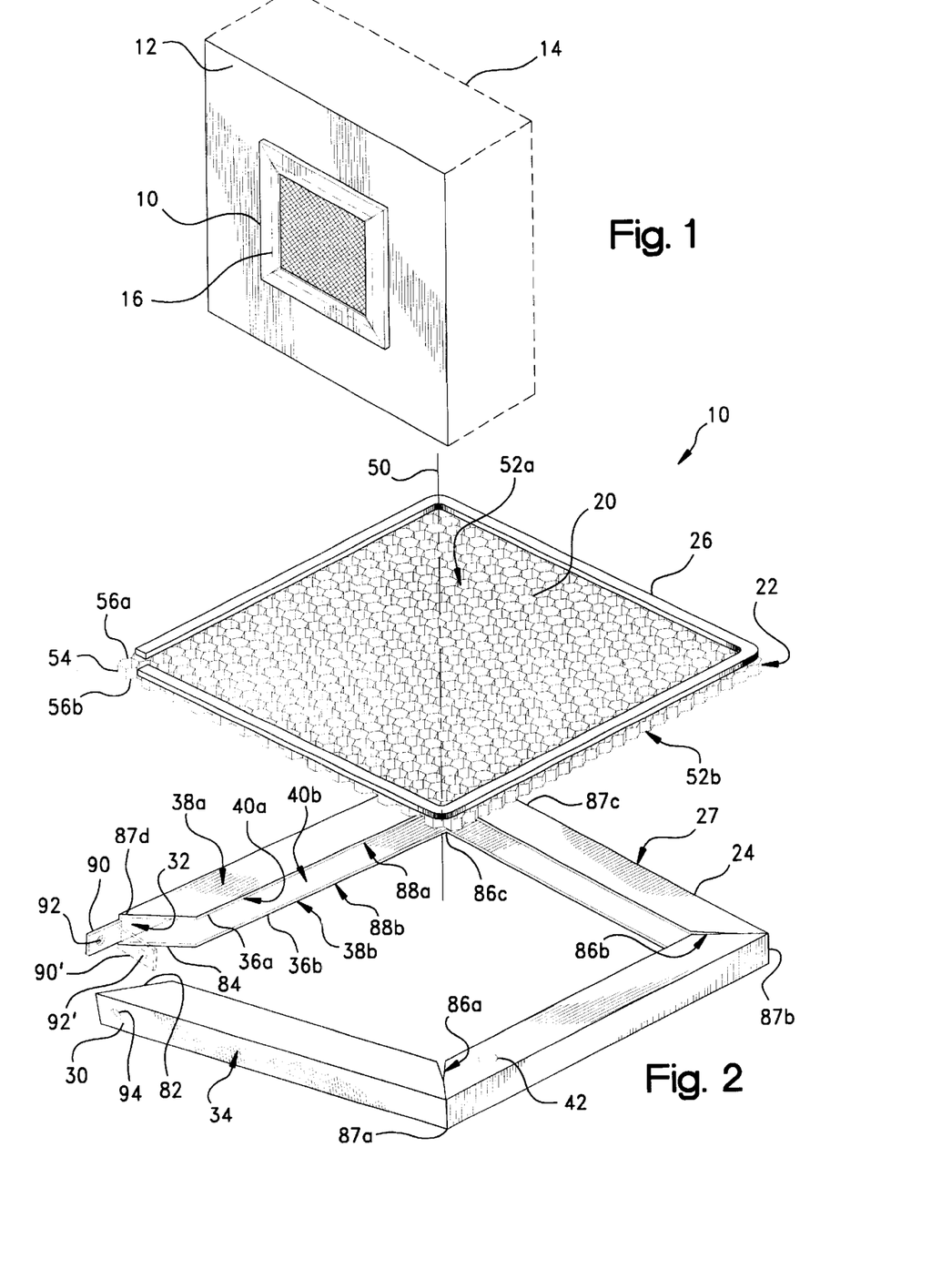
FIG. 1 is a perspective view of a representative electronics enclosure including an EMI shielded vent panel according to the present invention.
FIG. 2 is an exploded perspective view of the EMI shielded vent panel of FIG. 1 showing the frame, medium, and gasket elements thereof.

Referring then to the remaining figures wherein corresponding reference characters are used to designate corresponding elements throughout the several views, EMI shielded vent panel 10 of FIG. 1 reappears in the exploded view of FIG. 2. As may be seen, in basic construction panel 10 includes an electrically-conductive, generally-planar medium, 20, having an outer periphery, 22, which is supported within an electrically-conductive frame, 24, along with a generally resilient, electrically-conductive gasket, 26. For illustrative purpose, frame 24 is shown to have a perimeter, the extent of which is referenced at 27, which defines a generally polygonal geometry sized to circumscribe the margins of a similarly dimensioned vent opening. Depending upon the configuration of the corresponding opening, however, the perimeter 27 of frame 24 may be of any closed geometry.

As may be seen in the exploded view of FIG. 2, frame 24 preferably is formed from a length of an aluminum or other metal channel in a manner to be detailed hereinafter. Such channel may have, as is shown, a generally U- or C-shaped cross-sectional profile including an elongate end wall, 30, having an interior surface, 32, and an exterior surface, 34, and a pair of generally parallel, oppositely-disposed side walls, 36a–b, extending from the interior surface 32 of the end wall 30. Each of the side walls 36a–b, in turn, has an outer surface, 38a–b, and an inner surface, 40a–b, which is spaced-apart from the opposing inner surface 40a or 40b of the other side wall 36a or 36b.

The outer surface 38a or 38b of one or either of the side walls 36a or 36b is disposable about the opening of the housing 14 (FIG. 1) or other enclosure in an electrically-conductive contact adjacency with the surface 12 thereof. For lowering the impedance across the frame-housing interface, an electrically conductive seal or gasket member conventionally may be employed as mounted onto the confronting side wall outer surface 38a or 38b or as otherwise interposed between that surface and the housing surface 12. Such gasket may be constructed as having a resilient core element affording gap-filling capabilities which is either loaded, sheathed, or coated with an electrically conductive element. The resilient core element, which may be foamed or unfoamed, solid or tubular, typically is formed of an elastomeric thermoplastic material such as polyethylene, polypropylene, polyvinyl chloride, or a polypropylene-EPDM blend, or a thermoplastic or thermosetting rubber such as a butadiene, styrene-butadiene, nitrile, chlorosulfonate, neoprene, urethane, silicone, or fluorosilicone.

Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Other conductive particles and fibers such as carbon, graphite, plated glass, or a conductive polymer material may be substituted. The gasket, alternatively, may be provided to be of an all-metal, knitted wire construction, or as a formed-in-place (FIP) bead of a curable, electrically-conductive silicone or urethane composition which is dispensed in a fluent state onto the surface of the frame or housing and then is cured in situ via the application of heat or with atmospheric moisture.

As mentioned, the panel 10 is mountable onto surface 12 of housing 14 using screws, bolts, or other fastening members. In this regard, frame 24 may be provided has having a plurality of fastener-receiving apertures, one of which is referenced in phantom at 42, formed through side walls 38a–b as indexed for registration with a corresponding aperture formed within the housing surface 12. Alternatively, frame 24 may be attached to the housing 14 using an electrically conductive adhesive, or otherwise as configured for an interference fit within the housing opening.

Figure 5:
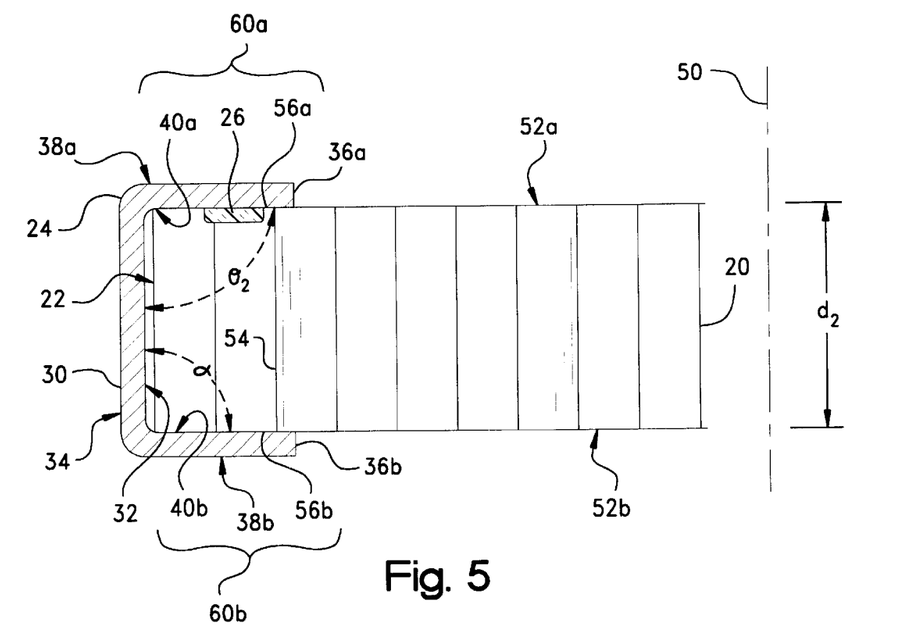
FIG. 5 is an enlarged, generally schematic cross-sectional view of the vent assembly of FIG. 3D taken through line 5—5 of FIG. 3D.

Electrically-conductive medium 20 extends along a transverse axis, 50, intermediate a pair of opposing medium faces, 52a–b, defining a thickness dimension therebetween which may range, typically, from about 0.25–1 inch (0.635–2.54 cm). Although medium 20 may be provided as a metal screen or expanded metal mesh, it more preferably is provided, as is shown in FIG. 2, as having a hexagonal, i.e., honeycombed, or other cellular structure which is "open" or otherwise porous to admit the flow of cooling air therethrough for the ventilation of the associated housing or other electronics enclosure. Such cellular structure of medium 20, which may be formed from a corrugated sheet of a 1–5 mil (0.039–0.197 mm) thick aluminum or other metal foil material, or otherwise as is described in U.S. Pat. No. 3,821,463, includes a plurality of cells, one of which is referenced at 54. Each of the cells 54 define a corresponding ventilation passageway of the medium 20 as extending through the thickness direction thereof generally along or parallel to the transverse axis 50 from, as is shown for cell 54, a first end, 56a, which forms a segment of the medium face 52a, and a second end, 56b, which forms a segment of the medium face 52b. As may be seen best with momentary reference to the assembled view of FIG. 3D, and with particular additional reference to the cross-sectional view thereof shown in FIG. 5, the thickness dimension of the outer periphery 22 of medium 20 is received intermediate the inner surfaces 40a–b of side walls 36a–b such that each of the walls 36a–b extends over a corresponding edge portion, referenced in FIG. 5 at 60a–b, respectively, of the medium faces 52a–b.

Optionally, a dust filter (not shown) may be employed in conjunction with medium 20 as disposed parallel thereto in a series arrangement relative to the air flow direction. Such filter may be formed of a screen or a high porosity foam or the like which allows for sufficient air flow therethrough while reducing the transmission of dust or other airborne contaminants into the enclosure. The filter may be attached to the outside, relative to the enclosure, of the frame in a conventional manner, but preferably is made to be removable for easier cleaning and replacement.

Returning to FIG. 2, it further may be seen that electrically-conductive gasket 26 is provided to extend along substantially the entire frame perimeter 27 and medium outer margin 22 as interposed between, for example, the inner surface 40a of side wall 36a and the edge portion 60a of medium face 52a. In this regard, and as may be seen best with momentary reference again to the cross-sectional view of FIG. 5, gasket 26 is deflectable between the side wall inner surface 40a and the medium face 52a from a normal orientation to a collapsed orientation effective to provide, in accordance with the precepts of the present invention, substantially continuous electrical contact between the frame 24 and the medium 20.

In the preferred embodiment of the invention illustrated in FIG. 1, gasket 26 is provided as a single length of an electrically-conductive strip material. For lowering the electrical impedance across the frame-medium interface, such material preferably exhibits gap-filling capabilities, and, as before, may be of a construction including a resilient core element which is either loaded, sheathed, or coated with an electrically conductive element. The resilient core element, which again may be foamed or unfoamed, solid or tubular, may formed of an elastomeric thermoplastic material such as polyethylene, polypropylene, polyvinyl chloride, or a polypropylene-EPDM blend, or a thermoplastic or thermosetting rubber such as a butadiene, styrene-butadiene, nitrile, chlorosulfonate, neoprene, urethane, silicone, or fluorosilicone. Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Other conductive particles and fibers such as carbon, graphite, plated glass, or a conductive polymer material may be substituted.

In an particularly economical construction, however, gasket 26 is provided to be formed of a continuous metal wire which, depending upon the application, may be aluminum, Monel (nickel-copper alloy), or Ferrex® (tin-platted, copper-clad steel) sized to a diameter of between about 0.002–0.006 inch (0.05–0.15 mm). The wire may be knitted into a plurality of spring-like interlocking loops to form a mesh, which mesh then may be rolled, drawn, or otherwise formed into a compressible strip having a rectangular or round cross-section of a nominal widthwise dimension or diameter ranging between about 0.062–0.5 inch (1.57–12.7 mm). Wire mesh strip gaskets so formed generally are highly resilient in exhibiting a compression/deflection response of between about 50–80%. Commercial gaskets of such type are marketed by the Chomerics Division of Parker-Hannifin Corp. (Woburn, Mass.) under the tradename "Mesh Strip®."

With continuing reference to FIG. 2, and looking sequentially to FIGS. 3A–3D, a preferred method of assembly is described in further accordance with the present invention. Advantageously, by virtue of the described construction of panel 10, frame 24 may be economically formed from a single length of a metal channel, such as the channel 80 depicted in FIG. 3A which extends intermediate a mitered first end, 82, and correspondingly-mitered second end, 84. Channel 80 may be provided as a conventionally roll formed from a 25–60 mil (0.63–1.52 mm) thick sheet of aluminum or another metal. Roll forming is a cold working process which, as described in U.S. Pat. Nos. 4,354,372; 5,272,899; 5,527,625; 5,640,869, is well known in the metal forming arts.

Figures 3A, 3B:
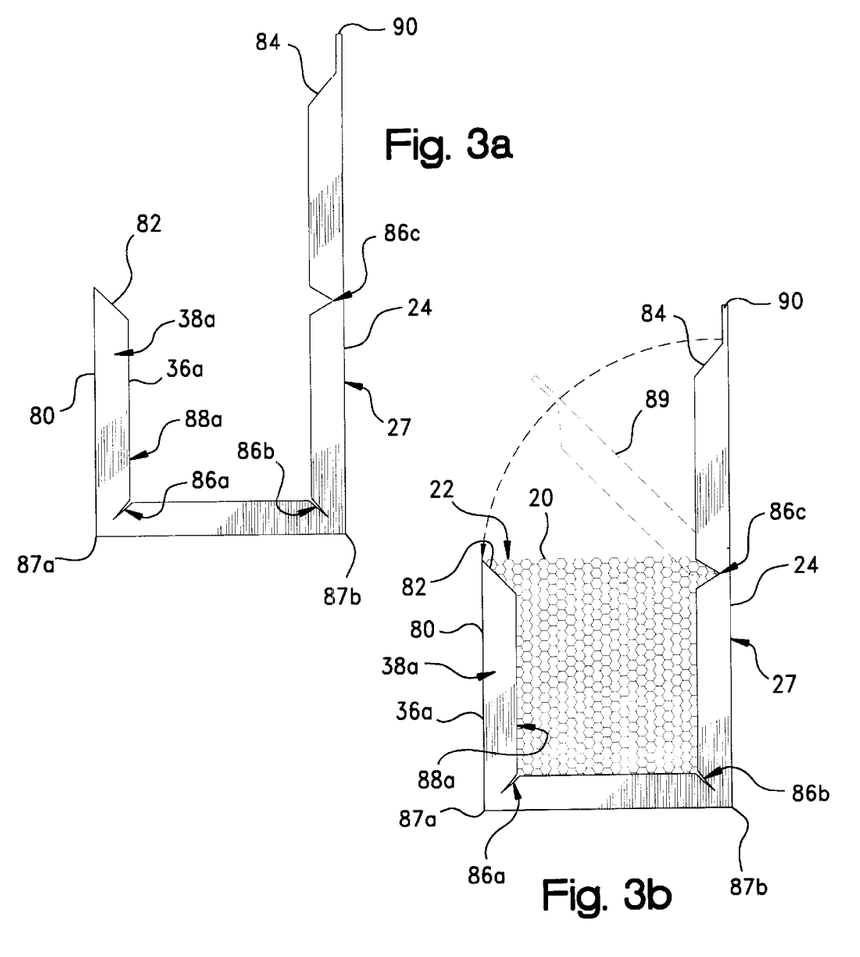
FIG. 3A is an assembly view showing the bending of a roll formed channel to partially form the frame of FIG. 2.
FIG. 3B is a continuing assembly view showing the medium of FIG. 2 being received within the frame of FIG. 3A.

In the preferred embodiment shown in FIG. 3A, channel 80 is provided as having three spaced-apart pairs of generally V-shaped notch pairs, 86a–c, each of which notch pairs extends from the inboard edges, 88a–b, of side walls 36a–b through a portion thereof. As is shown in FIG. 3A, channel 80 is bendable or otherwise foldable through each of the notch pairs 86a and 86b to form the corners 87a and 87b, respectively, of a generally U-shaped subassembly into which, as is shown in FIG. 3B, medium 20 may be received. Thereafter, and as is shown in phantom at 89 in FIG. 3B, channel 80 then may be folded through notch 86c to form the corner 87c shown in FIG. 3C, and to dispose second end 84 in diametrically opposed adjacency with first end 82 to define the corner 87d and the interface 86d between the opposing channel ends 82 and 84.

For securing the ends 82 and 84 thereof, channel 80 further may be provided as having a tab, best seen at 90 in FIG. 2, integrally formed at second end 84 as an extension of end wall 30. Tab 90 includes a fastener receiving hole, 92, which is disposable in registration with a corresponding hole 94 formed into end wall 30 at first end 82. As is shown in phantom at 90', tab 90 is foldable inwardly about end wall 30 to complete the corner 87d and to overlap first end 82 disposing, as is shown at 92', hole 92 in registration with hole 94. Lastly with respect to the assembly of frame 24, a rivet or other fastening member, referenced at 96 in FIG. 3C, may be received through the registered holes 92 and 94 for joining channel ends 82 and 84 and thereby securing the perimeter 27 of frame 24 into a closed geometry.

Figure 3C:
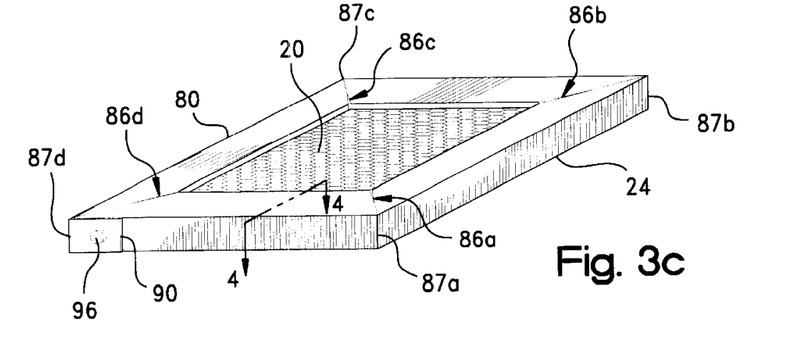
FIG. 3C is a continuing assembly view showing the assembled frame and medium of FIG. 3B with the gasket of FIG. 2 installed and prior to the compressing of the frame.

With frame 24 being assembled as in FIG. 3C such that medium 20 is supported therein, gasket 26 then may be installed within the subassembly by being press fit or otherwise inserted intermediate, for example, the inner surface 40a of side wall 36a and the face 52a of medium 20. Without departing from the precepts of the present invention, however, gasket 26 alternatively may be inserted intermediate the inner surface 40b of side wall 36b and the face 52b of medium 20. A pair of such gaskets, moreover, may be employed with one disposed intermediate each of the side wall inner surfaces 40a–b and the confronting medium face 52a–b.

Figure 4:
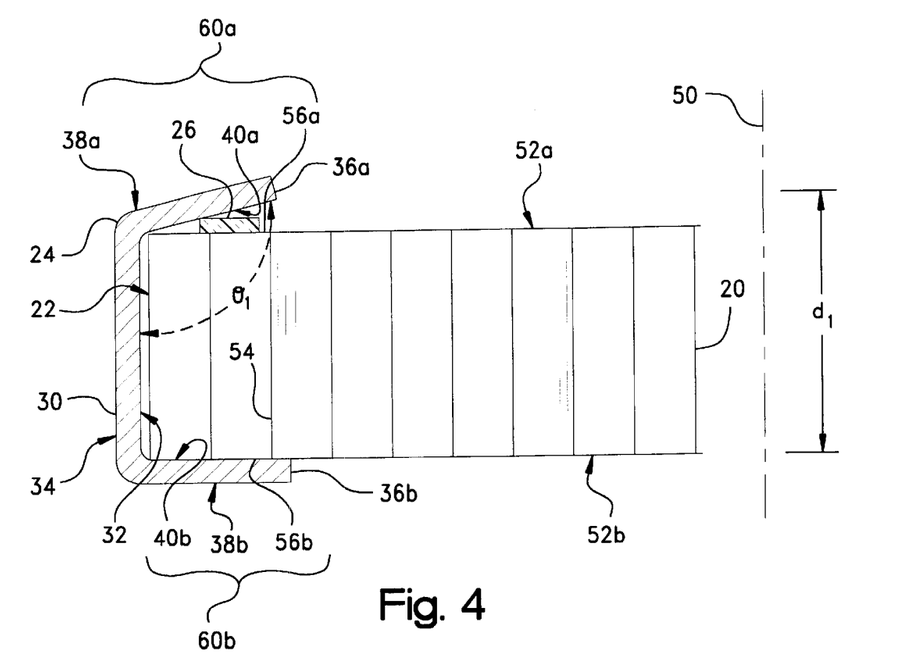
FIG. 4 is an enlarged, generally schematic cross-sectional view of the vent subassembly of FIG. 3C taken through line 4—4 of FIG. 3C.

For accommodating the installation of gasket 26, and with additional reference to the somewhat schematic cross-sectional view of the assembly of FIG. 3C shown in FIG. 4, it will be appreciated that channel 80 preferably is provided such that the confronting inner surfaces 40 of side walls 36 are spaced apart a first predetermined distance, referenced in FIG. 4 at $d_1$, sized to receive the thickness dimension of the outer periphery 22 of medium 20 and the widthwise extent of gasket 26. In this regard, channel 90 may be roll formed with side wall 36*a* being oriented such that the inner surface 40*a* thereof defines a generally obtuse angle, referenced at $\theta_1$, of preferably between about 92–100° with the interior surface 32 of frame end wall 30 corresponding to an angle of between about 2–10° with the medium face 52*a*. As also is shown in FIG. 4, the other side wall 36*b* may be oriented such that the inner surface 40*b* thereof defines a generally right angle, referenced at α, with the frame end wall interior surface 32.

Figure 3D:
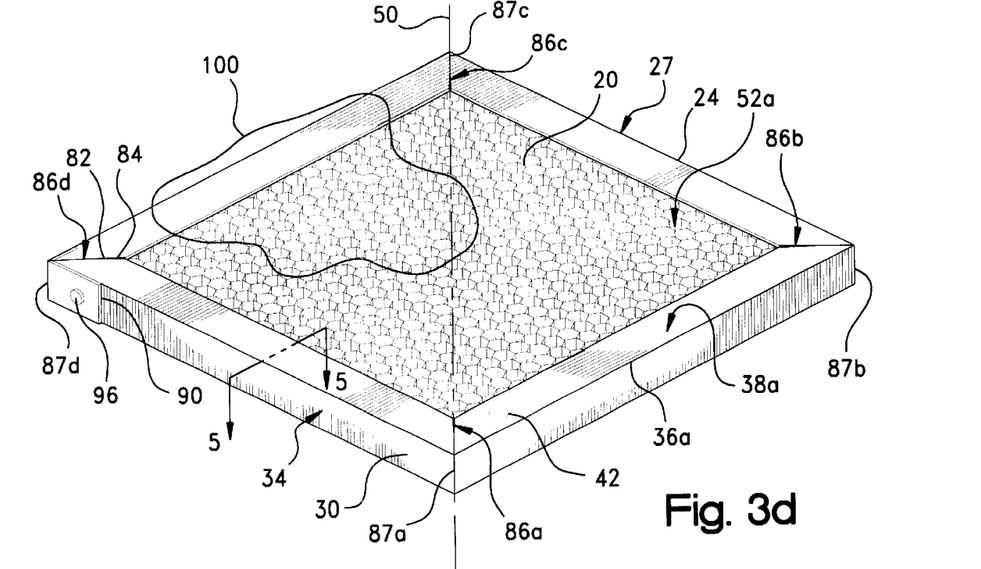
FIG. 3D is a continuing assembly view showing the vent subassembly of FIG. 3C following the compression of the frame.

Following the installation of gasket 26 the panel subassembly shown in FIG. 3C may be compressed under a force, referenced 98, directed generally normal to the outer surfaces 38*a–b* of side walls 36*a–b* to form the final panel assembly 10 shown in FIG. 3D. Such compression may be effected within a conventional platen press operated under a pressure which may range from about 300–1000 psi (2070–6895 kPa). As may be seen best with additional reference to the somewhat schematic cross-section view of assembly 10 shown in FIG. 5 and to the cut-away perspective view of the panel detail 100 shown in FIG. 6, frame 24 is compressed such that the side wall inner surfaces 40*a–b* are spaced-apart a second predetermined distance, referenced in FIG. 5 at $d_2$, with side wall 36*a* being re-oriented to dispose the inner surface 40*a* thereof at a generally right angle, referenced at $\theta_2$, relative to the interior surface 32 of frame end wall 30. In such orientation of frame 24, and with gasket 26 being disposed over the first ends 56*a* of a linear progression, referenced at 102, of cells 54 extending generally along the outer periphery 22 of medium 20, gasket 26 is compressed by up to about 50% of its original widthwise extent or diameter into a collapsed orientation effective to provide substantially continuous electrical contact between frame 24 and medium 20. In this regard, the provision and deflection of gasket 26 has been observed to lower the electrical impedance across the frame-medium interface by 10% or more, but without requiring the penetration of the medium by an extrusion-formed projection of the frame or the need for a separate conductive coating or plating applied to the gasket.

Figures 6, 7:
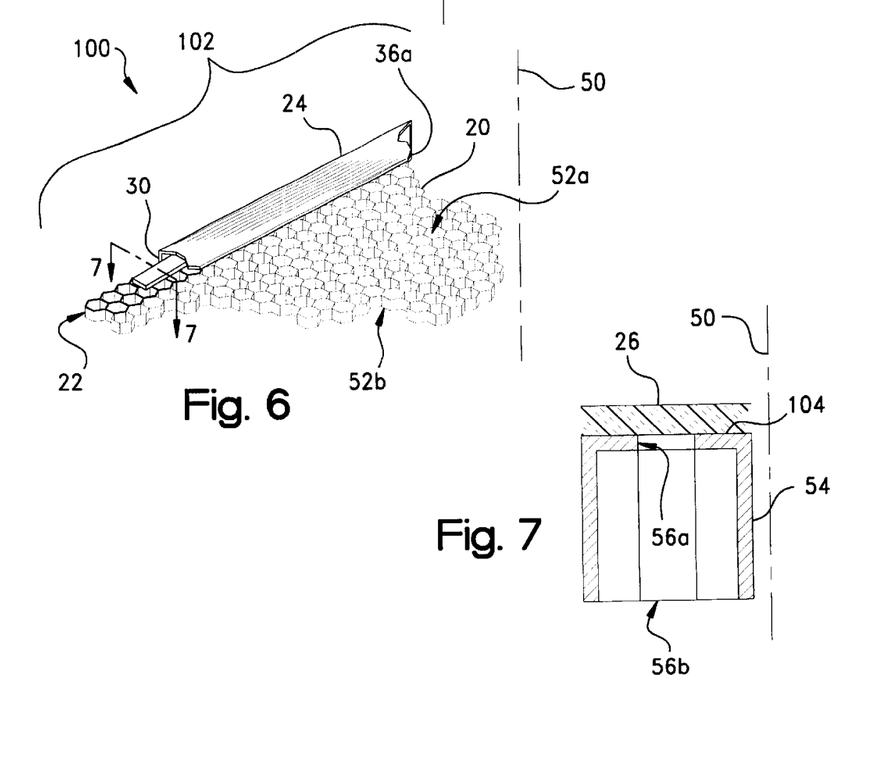
FIG. 6 is perspective view showing a portion of the vent assembly of FIG. 3D with a section of the frame member being cut-away to detail the compression of the gasket member therein.
FIG. 7 is an enlarged cross-sectional view taken through line 7—7 of FIG. 6 and illustrating the electrical contact between the gasket and medium.

Advantageously, and as may be seen best in FIG. 6, the first ends 56*a* of the cells 54 in progression 102 under gasket 26 may, in the compressed orientation of the frame 24, be inwardly deflected concomitantly with the compression of gasket 26. With reference to the cross-sectional view of FIG. 7, it may be seen that as deflected, the first ends 56 of the cell progression 102 of FIG. 6 assume a folded orientation presenting a generally planar contact surface, 104, with gasket 26. Such surface 104, which may be disposed, as is shown, generally perpendicular to the transverse axis 50 of medium 20, increases the area of electrical contact between medium 20 and gasket 26, and thereby lowers the impedance across the frame-medium interface.

Thus, a EMI shielded vent construction for electronics enclosures is described which exhibits reliable EMI shielding in ensuring the grounding of the enclosure across the vent opening. Such construction additional is exceptionally economical to manufacture in allowing the use of a roll formed frame, and in ensuring good electrical contact between the shielding media without the need for a separate metal plating. These use of a roll formed frame construction additionally eliminates the need and expense of having to provide welded frame joints at the corners of the panel.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. A method of making an electromagnetic interference (EMI) shielded vent panel for disposition over a corresponding opening formed within a surface of an electronics enclosure, the opening having a predefined outer margin and said method comprising the steps of:

(a) providing an electrically-conductive medium having an outer periphery and extending along a transverse axis intermediate a pair of faces defining a thickness dimension therebetween, said medium have a plurality of ventilation passageways extending through said thickness direction generally along said transverse axis;

(b) supporting the thickness dimension of the outer periphery of said medium within an electrically-conductive frame having a perimeter defining a closed geometry configured to circumscribe the opening of the electronics enclosure, said frame having a generally C-shaped cross-sectional profile including an elongate end wall having an interior surface and an exterior surface, and a pair of oppositely-disposed side walls extending from the interior surface of said end wall, each of said side walls having an outer surface and an inner surface spaced-apart a first predetermined distance from the inner surface of the other of said side walls, the outer periphery of said medium being received intermediate the inner surfaces of said side walls such that each of said walls extends over a corresponding edge portion of the faces of said medium, with the outer surface of one of said side walls being disposable about the opening of the enclosure in electrically-conductive adjacency with the surface thereof;

(c) disposing an electrically-conductive gasket intermediate the inner surface of a first one of said side walls and the edge portion of a first one of the faces of said medium, said gasket extending along substantially the entire perimeter of said frame and being deflectable between the inner surface of said first one of said side walls and the edge portion of said first one of the faces of said medium; and (d) compressing said frame to space the inner surface of each of said side walls thereof a second predetermined distance from the inner surface of the other of said side walls deflecting said gasket into a collasped orientation effective to provide substantially continuous electrical contact between said frame and said medium.

2. The method of claim 1 wherein said medium is provided as a metal foil material which is corrugated into a plurality of cells, each of said cells extending along the transverse axis of said medium from a first end forming a segment of the first one of the faces of said medium to a second end forming a segment of the second one of the faces of said medium, and defining one of said ventilation passageways extending through said medium.

3. The method of claim 2 wherein said gasket is disposed in step (c) over the first ends of a progression of said cells extending along the outer periphery of said medium, and wherein said first ends of said progression of said cells are deflected in step (d) under said gasket into a folded orientation presenting an electrical contact surface with said gasket disposed generally perpendicular to the transverse axis of said medium.

4. The method of claim 1 wherein said gasket is disposed in step (c) as a strip of a resilient, knitted wire mesh material.

5. The method of claim 1 wherein said frame is provided in step (b) as a rolled-formed, metal channel which extends from a first end to a second end, said channel being folded intermediate said first and said second end to form said frame.

6. The method of claim 1 wherein a first one of said side walls of said frame of step (b) is oriented such that the inner surface thereof defines a generally obtuse angle with the interior surface of said end wall with said gasket being disposed in step (c) intermediate the inner surface of said first one of said side walls and the edge portion of said first one of the faces of said medium, and wherein said frame is compressed in step (d) to dispose the inner surface of said first one of said side walls generally perpendicular to the interior surface of said end wall.

7. The method of claim 6 wherein the second one of said side walls of said frame of step (b) is oriented such that the inner surface thereof is disposed generally perpendicular to the interior surface of said end wall.

8. The EMI shielded vent panel made by the method of claim 1.

* * * * *